(12) United States Patent
Oh et al.

(10) Patent No.: US 9,117,675 B2
(45) Date of Patent: Aug. 25, 2015

(54) SEMICONDUCTOR DEVICE PRODUCTION METHOD

(71) Applicant: FUJITSU SEMICONDUCTOR LIMITED, Yokohama-shi, Kanagawa (JP)

(72) Inventors: Junji Oh, Kuwana (JP); Masanori Terahara, Kuwana (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 0 days.

(21) Appl. No.: 13/965,629

(22) Filed: Aug. 13, 2013

(65) Prior Publication Data

US 2014/0057421 A1 Feb. 27, 2014

(30) Foreign Application Priority Data

Aug. 21, 2012 (JP) ................ 2012-182304

(51) Int. Cl.
| | |
|---|---|
| H01L 21/22 | (2006.01) |
| H01L 21/426 | (2006.01) |
| H01L 21/02 | (2006.01) |
| H01L 21/8238 | (2006.01) |
| H01L 21/265 | (2006.01) |
| H01L 21/762 | (2006.01) |
| H01L 29/78 | (2006.01) |

(52) U.S. Cl.
CPC ...... *H01L 21/02658* (2013.01); *H01L 21/2652* (2013.01); *H01L 21/76224* (2013.01); *H01L 21/823807* (2013.01); *H01L 21/823878* (2013.01); *H01L 21/823892* (2013.01); *H01L 29/78* (2013.01); *H01L 21/0262* (2013.01); *H01L 21/02532* (2013.01)

(58) Field of Classification Search
CPC ............. H01L 21/02658; H01L 21/02532; H01L 21/0262; H01L 21/823807; H01L 21/823892; H01L 21/823878; H01L 21/762
USPC .............. 438/499, 506, 527, 528, 546
See application file for complete search history.

(56) References Cited

U.S. PATENT DOCUMENTS

| | | | |
|---|---|---|---|
| 6,030,862 A * | 2/2000 | Kepler ............... | 438/217 |
| 7,122,452 B2 | 10/2006 | Pawlak | |
| 7,678,640 B1 * | 3/2010 | Polishchuk et al. ...... | 438/217 |
| 2007/0293016 A1 * | 12/2007 | Luo et al. ............. | 438/424 |

(Continued)

FOREIGN PATENT DOCUMENTS

| | | |
|---|---|---|
| JP | 05-275637 A | 10/1993 |
| JP | 2005-268792 A | 9/2005 |

*Primary Examiner* — Christine Enad
(74) *Attorney, Agent, or Firm* — Westerman, Hattori, Daniels & Adrian, LLP

(57) ABSTRACT

A semiconductor device production method includes: forming a protection film on a semiconductor substrate; forming a first resist pattern on the protection film; implanting a first impurity ion into the semiconductor substrate using the first resist pattern as a mask; removing the first resist pattern; forming on the surface of the semiconductor substrate a chemical reaction layer that takes in surface atoms from the semiconductor substrate through chemical reaction, after the removing of the first resist pattern; removing the chemical reaction layer formed on the semiconductor substrate and removing the surface of the semiconductor substrate, after the forming of the chemical reaction layer; and growing a semiconductor layer epitaxially on the surface of the semiconductor substrate, after the removing of the surface of the semiconductor substrate.

5 Claims, 22 Drawing Sheets

(56) References Cited

U.S. PATENT DOCUMENTS

| | | | |
|---|---|---|---|
| 2008/0138946 A1* | 6/2008 | Lee | 438/200 |
| 2010/0047993 A1* | 2/2010 | Pinto et al. | 438/400 |
| 2012/0083080 A1* | 4/2012 | Shifren et al. | 438/232 |
| 2012/0083082 A1* | 4/2012 | Fujita et al. | 438/270 |

* cited by examiner

SEMICONDUCTOR DEVICE PRODUCTION METHOD

CROSS-REFERENCE TO RELATED APPLICATION

This application is based upon and claims the benefit of priority of the prior Japanese Patent Application No. 2012-182304, filed on Aug. 21, 2012, the entire contents of which are incorporated herein by reference.

FIELD

The embodiments discussed herein are related to a semiconductor device production method.

BACKGROUND

For production of semiconductor devices, a known technique is to use a mask in order to implant an impurity into a predetermined region of a semiconductor substrate (for instance, see Japanese Unexamined Patent Publication (Kokai) No. HEI-5-275637).

For production of semiconductor devices, a known technique is to amorphize some portions of a semiconductor substrate, implant an impurity into the amorphized portions, and then recrystallize the amorphized portions by heat treatment (for instance, see Japanese Unexamined Patent Publication (Kokai) No. 2005-268792).

SUMMARY

According to one aspect of the present invention, a semiconductor device production method includes: forming a protection film on a semiconductor substrate; forming a first resist pattern on the protection film; implanting a first impurity ion into the semiconductor substrate using the first resist pattern as a mask; removing the first resist pattern; forming on the surface of the semiconductor substrate a chemical reaction layer that takes in surface atoms from the semiconductor substrate through chemical reaction, after the removing of the first resist pattern; removing the chemical reaction layer formed on the semiconductor substrate and removing the surface of the semiconductor substrate, after the forming of the chemical reaction layer; and growing a semiconductor layer epitaxially on the surface of the semiconductor substrate, after the removing of the surface of the semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
FIGS. 1A to 1S are schematic cross sections illustrating major steps of a semiconductor device production process according to a comparative example.

Before explaining the aspects of the semiconductor device production process according to embodiments of the present invention, described below is the semiconductor device production process according to the comparative example. FIGS. 1A to 1S are schematic cross sections illustrating steps of the semiconductor device production process according to the comparative example.

Explained first are the DHF treatment, APM treatment, HPM treatment, and SPM treatment performed in the semiconductor device production processes according to the comparative example and embodiments.

The DHF treatment uses, as a chemical agent, an aqueous dilute hydrofluoric acid solution (DHF) prepared by mixing hydrofluoric acid (HF) in water ($H_2O$), and it is performed, for instance, for the removal of silicon oxide film and the removal of metal. Hereinafter, silicon oxide film may be referred to simply as oxide film.

The APM treatment uses, as a chemical agent, an aqueous ammonia and hydrogen peroxide mixture solution (APM) prepared by mixing a hydrogen peroxide solution ($H_2O_2$) and aqueous ammonia ($NH_4OH$) in water ($H_2O$), and it is performed, for instance, for the removal of particles.

The HPM treatment uses, as a chemical agent, an aqueous hydrochloric acid and hydrogen peroxide mixture solution (HPM) prepared by mixing a hydrogen peroxide solution ($H_2O_2$) and hydrochloric acid (HCl) in water ($H_2O$), and it is performed, for instance, for the removal of metal.

The SPM treatment uses, as a chemical agent, a sulfuric acid and hydrogen peroxide mixture solution (SPM) prepared by mixing a hydrogen peroxide solution ($H_2O_2$) and sulfuric acid ($H_2SO_4$), and it is performed, for instance, for the removal of resists.

Hereinafter, when a plurality of treatment steps are performed sequentially, those performed earlier are given to the left in expressing the sequence. If, for instance, APM treatment is performed first, DHF treatment performed after the APM treatment, and HPM treatment performed after the DHF treatment, the sequence is expressed as APM-DHF-HPM treatment.

Refer to FIG. 1A. A mask alignment mark MK is formed outside the product formation region on a silicon substrate 1. The silicon substrate 1 is subjected to APM-DHF-HPM treatment. After the oxide film on the substrate surface is removed by DHF treatment, a chemical oxide film (protection film) 2 with a thickness of, for instance, about 0.3 nm is formed by HPM treatment.

Figure 1B:
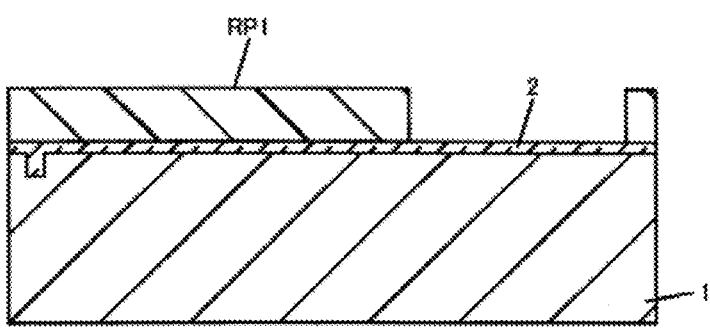

Refer to FIG. 1B. The oxide film 2 is coated with a photoresist, followed by light exposure, development, and pure water rinsing to form a resist pattern RP1. The resist pattern RP1 has an opening which exposes a p-type MOS transistor formation region.

Figure 1C:
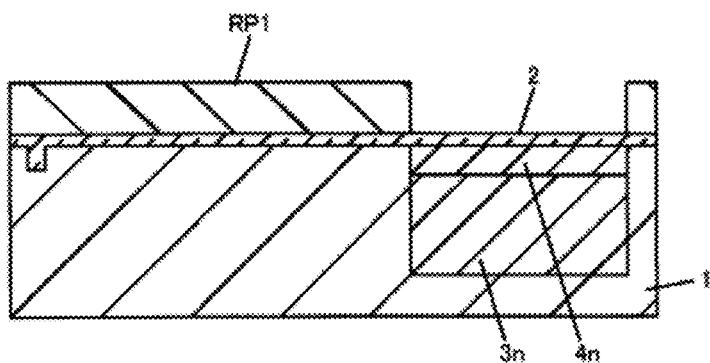

Refer to FIG. 1C. Using the resist pattern RP1 as a mask, an impurity is implanted into the silicon substrate 1 through the oxide film 2 (using the oxide film 2 as protection film) as described below. For instance, P, used as an n-type impurity, is implanted at an implantation energy of 360 keV to a doze of $7.5 \times 10^{12}$ $cm^{-2}$ from four directions (total doze of $3 \times 10^{13}$ $cm^{-2}$) to form an n-type well region 3n. For instance, As, used as an n-type impurity, is implanted at an implantation energy 60 keV to a doze of $2 \times 10^{13}$ $cm^{-2}$, or Sb, used as an n-type impurity, is implanted at an implantation energy 20 keV to a doze of $1 \times 10^{13}$ $cm^{-2}$, to form an n-type channel region 4n.

Figure 1D:
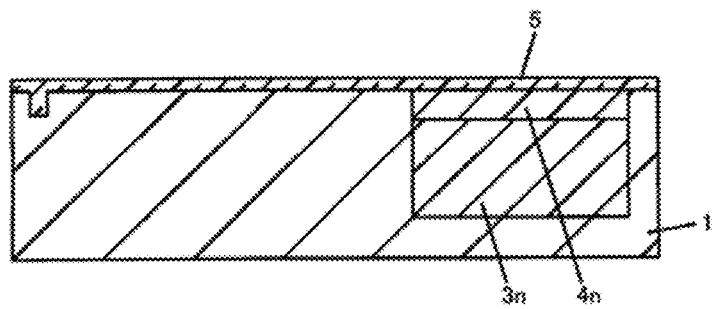

Refer to FIG. 1D. The resist pattern RP1 is removed by SPM-APM treatment. The chemical oxide film 2 slightly thickens as a result of the SPM-APM treatment. Subsequently, APM-DHF-HPM treatment is performed. After the oxide film 2 is removed by the DHF treatment, a chemical oxide film (protection film) 5 with a thickness of, for instance, about 0.3 nm is formed by the HPM treatment.

Figure 1E:
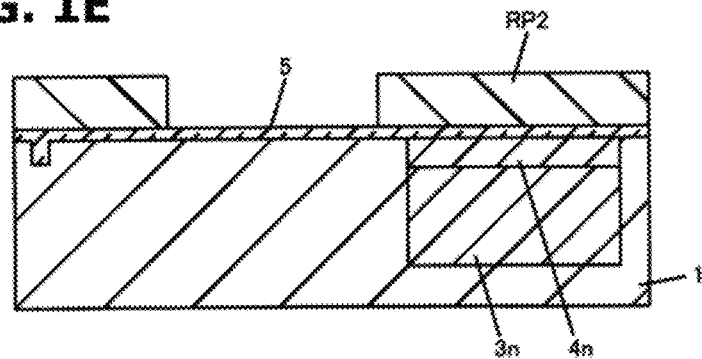

Refer to FIG. 1E. The oxide film 5 is coated with a photoresist, followed by light exposure, development, and pure water rinsing to form a resist pattern RP2. The resist pattern RP2 has an opening which exposes an n-type MOS transistor formation region.

Figure 1F:
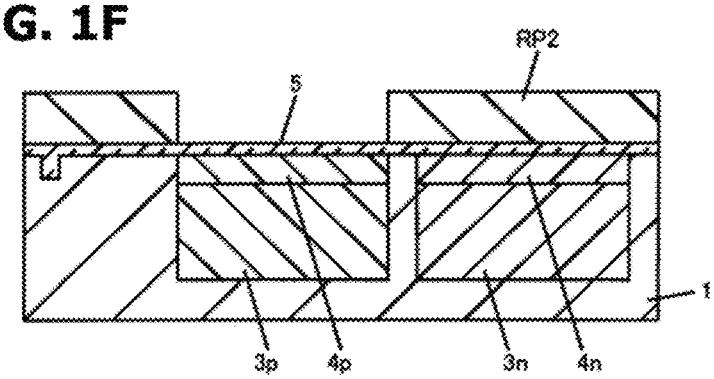

Refer to FIG. 1F. Using the resist pattern RP2 as a mask, impurities are implanted into the silicon substrate 1 through the oxide film 5 (using the oxide film 5 as protection film) as described below. For instance, B, used as a p-type impurity, is implanted at an implantation energy of 150 keV to a doze of $7.5 \times 10^{12}$ $cm^{-2}$ from four directions (total doze of $3 \times 10^{13}$ $cm^{-2}$) to form a p-type well region 3p. Then, Ge (germanium) is implanted at an implantation energy of 50 keV to a doze of $5 \times 10^{14}$ $cm^{-2}$. After the Ge implantation, C (carbon) is implanted at an implantation energy of 3 keV to a doze of $3 \times 10^{14}$ $cm^{-2}$. After the C implantation, B (boron), used as a p-type impurity, is implanted at an implantation energy of 2 keV to a doze of $3 \times 10^{13}$ $cm^{-2}$ to form a p-type channel region 4p.

In forming the p-type channel region 4p, the Ge implantation amorphizes the surface of the silicon substrate 1. C suppresses the diffusion of B. Here, amorphization of the surface of the silicon substrate may be achieved by implanting Si (silicon) instead of Ge.

Figure 1G:
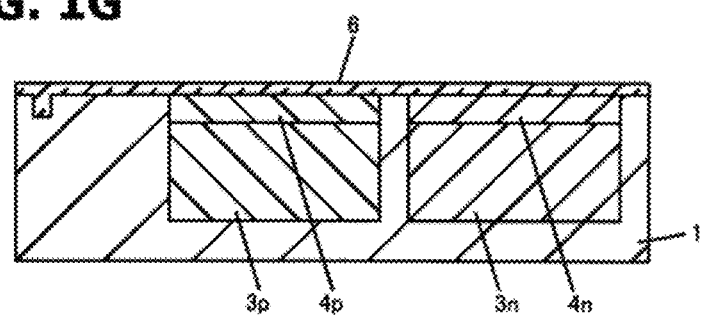

Refer to FIG. 1G. The resist pattern RP2 is removed by ashing and DHF-SPM-APM treatment. The oxide film 5 is removed by the DHF treatment. A chemical oxide film 6 with a thickness of, for instance, about 0.8 nm is formed by the SPM-APM treatment.

Figure 1H:
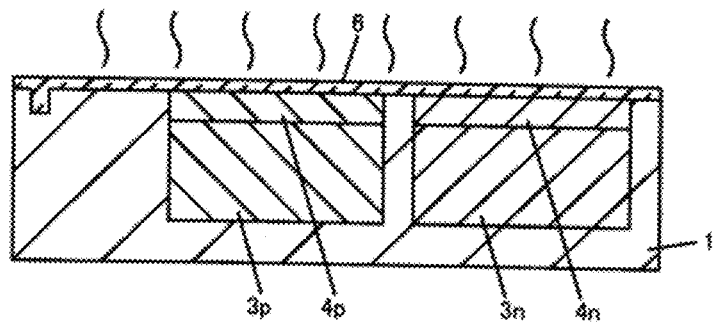

Refer to FIG. 1H. Crystallization is achieved, for instance, by performing heat treatment at 600° C. for 150 seconds. The crystallization treatment crystallizes the amorphized surface portion of the silicon substrate 1 in the n-type MOS transistor formation region, thus arranging B and C on the Si crystal lattice. The C atoms arranged on the lattice suppress the diffusion of B atoms by preventing the interstitial Si atoms resulting from, for instance, ion implantation performed later from bonding with the B atoms.

Figure 1I:
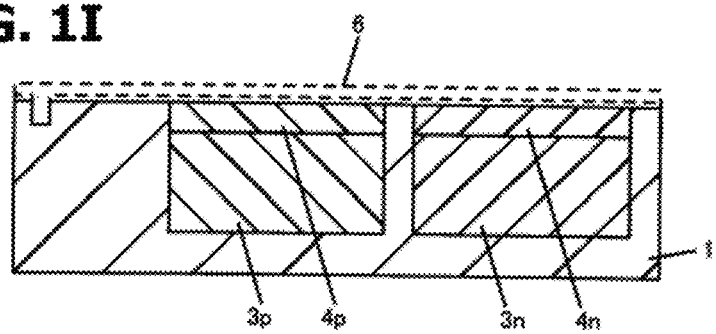

Refer to FIG. 1I. The oxide film 6 is removed by DHF treatment. Furthermore, tetramethyl ammonium hydroxide (TMAH) treatment is carried out to etch the surface of the silicon substrate 1, for instance, by a 3 nm thickness.

Figure 1J:
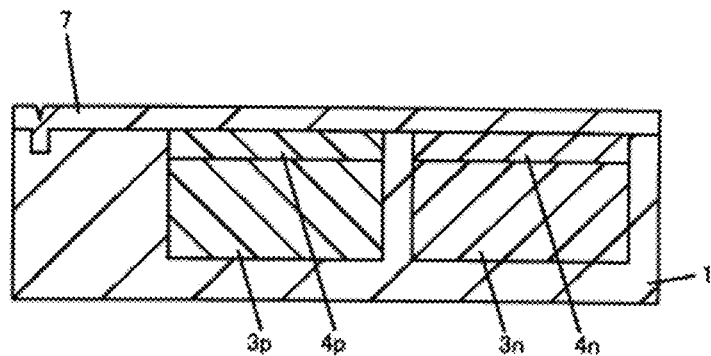

Refer to FIG. 1J. An undoped silicon film 7 is epitaxially grown to a thickness of, for instance, 30 nm on the silicon substrate 1. The silicon film 7 is formed, for instance, by chemical vapor deposition (CVD) using silane ($SiH_4$). The film formation conditions include, for instance, a temperature of 450° C. to 650° C. and duration of 30 min to 60 min. In later steps, a layer referred as silicon substrate 1 may include a silicon film 7.

Figure 1K:
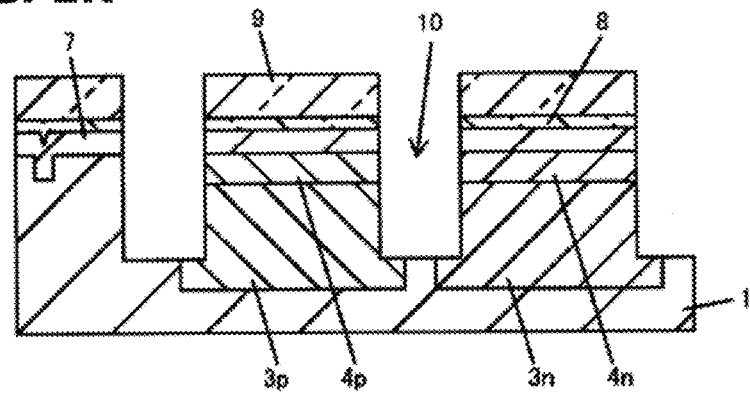

Refer to FIG. 1K. A silicon oxide film 8 with a thickness of about 3 nm is formed on the silicon film 7, for instance, by performing thermal oxidation at 810° C. for about 20 seconds. A silicon nitride film 9 with a thickness of about 90 nm is formed on the silicon film 8, for instance, by low pressure (LP) CVD (at a film formation temperature of 775° C.). The silicon nitride film 9, silicon oxide film 8, and silicon substrate 1 are patterned by photolithography and etching to form element separation grooves 10 on the silicon substrate 1.

Figure 1L:
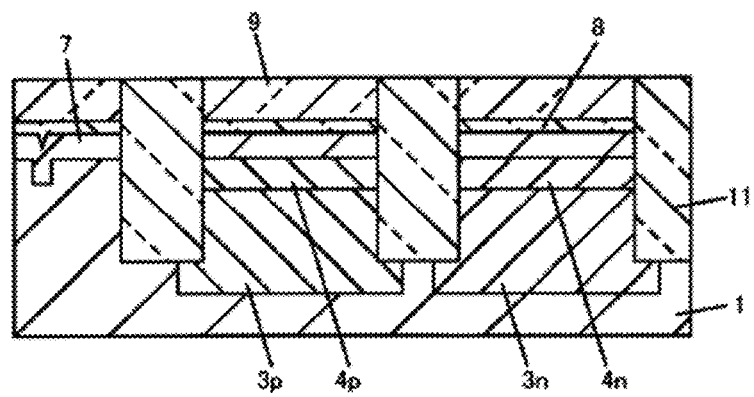

Refer to FIG. 1L. For instance, high density plasma (HDP) CVD (at a film formation temperature of 450° C.) is performed to form a silicon oxide film 11 that fills the element separation grooves 10. The silicon oxide film 11 is deposited so that it covers the silicon nitride film 9. Part of the silicon oxide film 11 is removed by chemical mechanical polishing (CMP) to the extent that the top face of the silicon nitride film 9 is exposed.

Figure 1M:
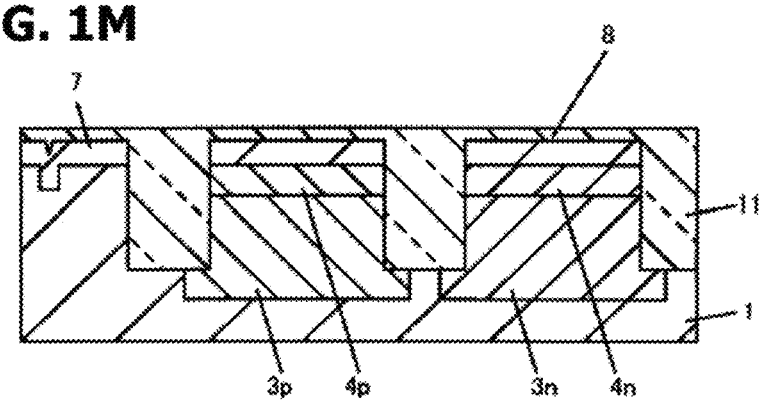

Refer to FIG. 1M. A top portion of the silicon oxide film 11 is removed by etching with dilute hydrofluoric acid, and the silicon nitride film 9 is removed by etching with phosphoric acid. In this way, the element separation is formed by shallow trench isolation (STI).

Figure 1N:
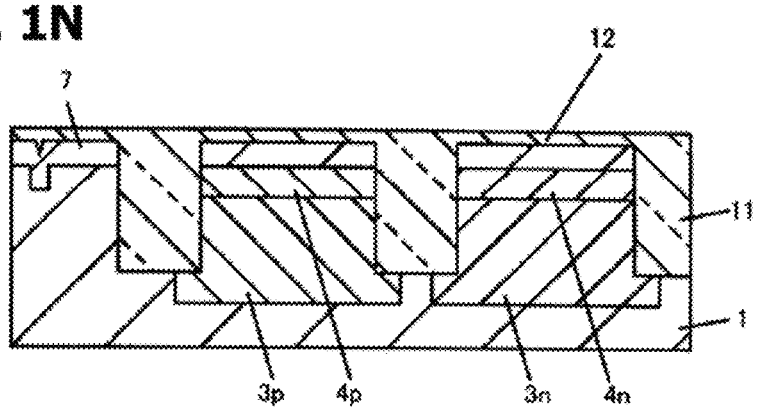

Refer to FIG. 1N. The silicon oxide film 8 is removed by etching with dilute hydrofluoric acid. Subsequently, for instance, a silicon oxide film with a thickness of 2 nm is grown by performing thermal oxidation at 810° C. for about 8 seconds to form a gate insulation film 12.

Figure 1O:
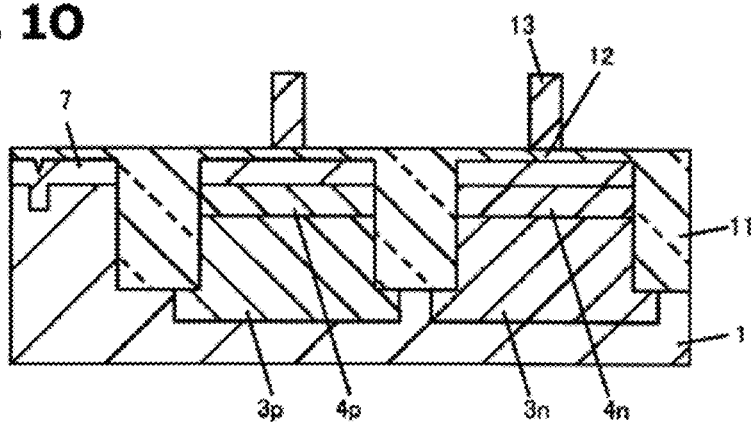

Refer to FIG. 1O. For instance, a polysilicon film with a thickness of 100 nm is formed on the gate insulation film 12 by carrying out LPCVD (at a film formation temperature of 605° C.). The polysilicon film is patterned by photolithography and etching to form gate electrodes 13.

Figure 1P:
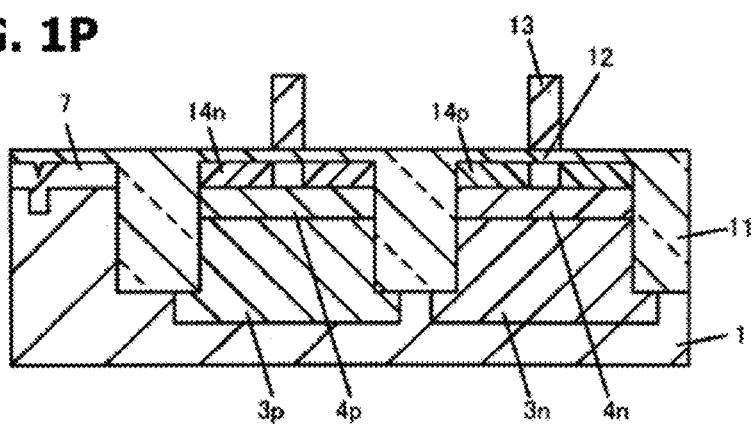

Refer to FIG. 1P. Using a resist pattern having an opening that exposes the n-type MOS transistor formation region, and gate electrode 13 as masks, As, for instance, is implanted at an implantation energy of 1 keV to a doze of $2 \times 10^{14}$ $cm^{-2}$ from four directions to form an n-type extension region 14n. Using a resist pattern having an opening that exposes the p-type MOS transistor formation region, and gate electrode 13 as masks, B, for instance, is implanted at an implantation energy of 0.3 keV to a doze of $9 \times 10^{13}$ $cm^{-2}$ from four directions to form a p-type extension region 14p. So-called halo ion implantation is not necessary and is not performed here.

Figure 1Q:
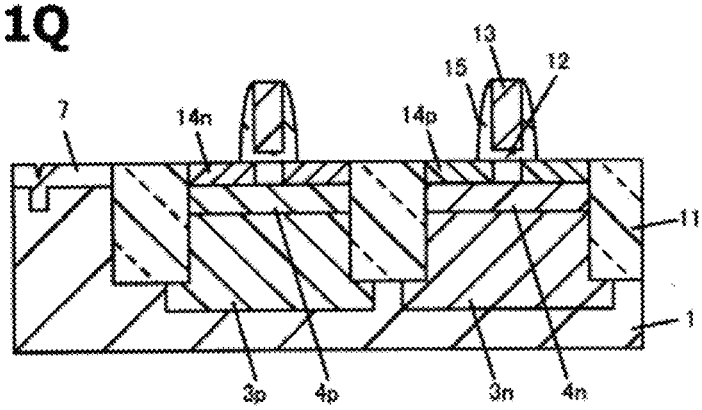

Refer to FIG. 1Q. For instance, a silicon oxide film with a thickness of 80 nm is formed by CVD (at a film formation temperature of 520° C.). This silicon oxide film is etched anisotropically by reactive ion etching (RIE) to form sidewall insulation films 15 on the side walls of the gate electrodes 13.

Figure 1R:
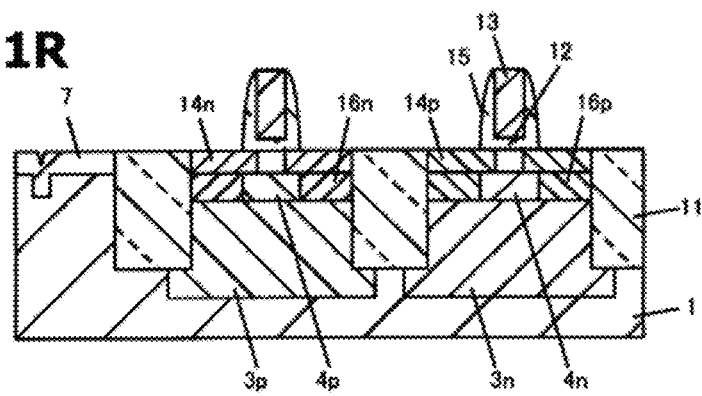
Figure 1S:
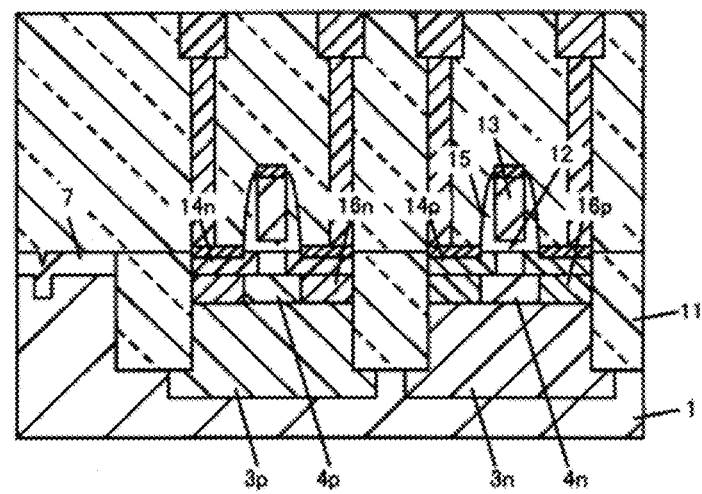

Refer to FIG. 1R. Using a resist pattern having an aperture that exposes the n-type MOS transistor formation region, gate electrode 13, and side wall insulation film 15 as masks, P, for instance, is implanted at an implantation energy of 8 keV to a doze of $1.2 \times 10^{16}$ cm$^{-2}$ to form n-type source/drain regions 16n. At the same time, the impurities are implanted into the gate electrode 13 in the n-type MOS transistor formation region.

Using a resist pattern having an aperture that exposes the p-type MOS transistor formation region, gate electrode 13, and side wall insulation film 15 as masks, B, for instance, is implanted at an implantation energy of 4 keV to a doze of $6 \times 10^{15}$ cm$^{-2}$ to form p-type source/drain regions 16p. At the same time, the impurities are implanted into the gate electrode 13 in the p-type MOS transistor formation region.

Subsequently, for instance, rapid thermal annealing (RTA) is carried out at 1025° C. for 0 second to cause the activation of the impurity implanted into the silicon substrate 1 and the diffusion of the impurity implanted into the gate electrodes 13. The conditions of 1025° C. and 0 second can serve satisfactorily to diffuse the impurity to the bottom (interface with the gate insulation film 12) of each gate electrode 13.

Compared to this, in the channel region of the n-type MOS transistor, C prevents the diffusion of B to maintain a steep impurity distribution, and in the channel region of the p-type MOS transistor, the diffusion of As or Sb is so slow that a steep impurity distribution is maintained.

Refer to FIG. 1S. For instance, a Co layer is formed by sputtering, and a silicide layer is formed, for instance, by performing heat treatment at 750° C. For instance, a silicon nitride film with a thickness of 50 nm is deposited by CVD (at a film formation temperature of 600° C.) to form an etch stop film. For instance, a silicon oxide film with a thickness of 500 nm is deposited by HDPCVD to form an interlayer insulation film.

Contact holes are formed in the interlayer insulation film and etch stop film by photolithography and etching. Electrically conductive plugs of W are formed in the contact holes. Subsequently, upper wiring structures are formed as required. Thus, a semiconductor device according to the comparative example is completed.

Described below are problems with the semiconductor device production method according to the comparative example. In performing the production method of the comparative example, it was seen that many defects were formed on the surface the silicon film 7 grown epitaxially in the n-type MOS transistor formation region.

Figure 2B:
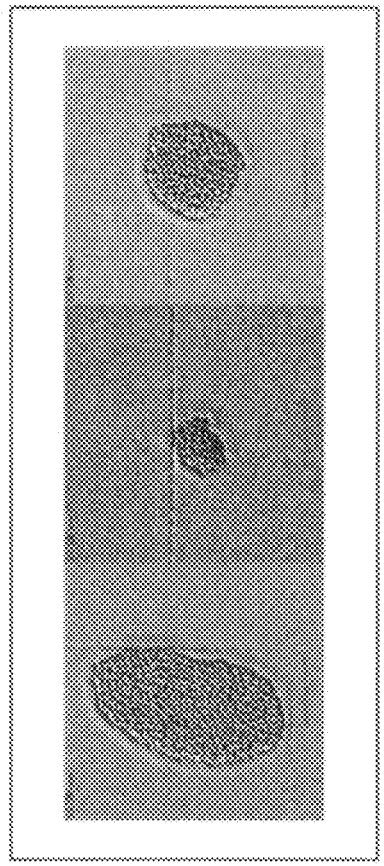
FIG. 2B is a SEM photograph of such defects.
Figure 2A:
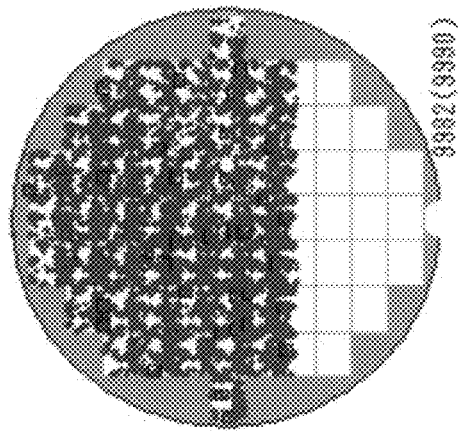
FIG. 2A is a plan view illustrating a distribution of defects on a wafer formed in the comparative example.

FIG. 2A is a plan view illustrating a distribution of defects on a wafer, and FIG. 2B gives scanning electron microscopic (SEM) photographs of such defects. As seen in FIG. 2A, many (about 10,000 or more) defects are formed over the entire surface of a wafer. Portions for which overflow took place in the measuring instrument are excluded from the defect distribution diagram. FIG. 2B gives three typical defects. These defects measure 10 to several tens of micrometers.

Furthermore, the production method according to the comparative example failed in producing good element separation grooves 10. Factors in these problems taking place in performing the production method according to the comparative example are discussed below with reference to FIGS. 3A to 3E. The following discussion is intended only to present a hypothesis.

Figure 3A:
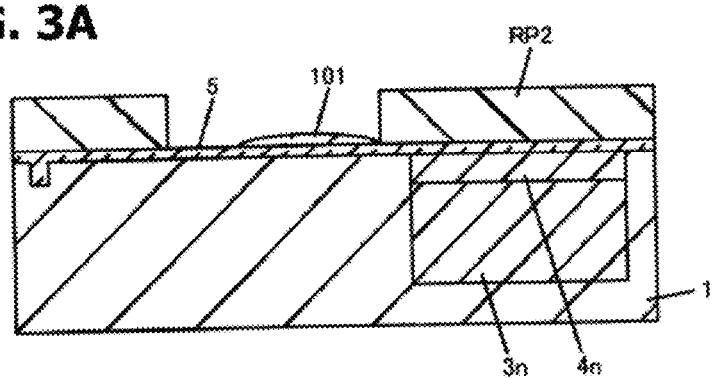
FIGS. 3A to 3E are schematic cross sections illustrating faults that can take place in the semiconductor device production process according to the comparative example.

Refer to FIG. 3A. FIG. 3A, which corresponds to FIG. 1E, illustrates a state where a resist pattern RP2 has been formed on an oxide film (protection film) 5. In the resist pattern RP2 formation step, pure water rinsing is performed and it can cause a defect (water mark) 101 on the protection film 5 in the opening region of the resist. This water mark 101 is considered to be of an oxide-film-like material having an amorphous structure.

Figure 3B:
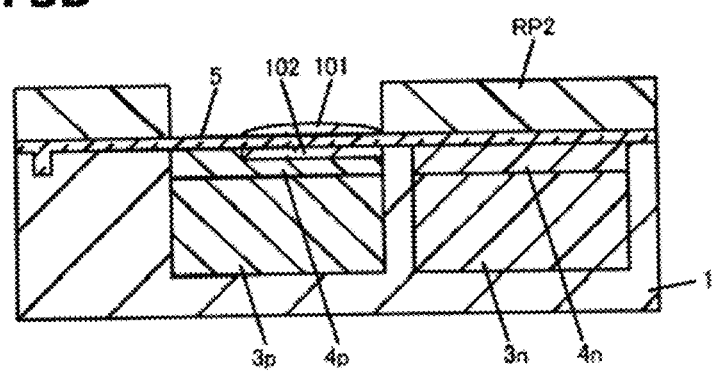

Refer to FIG. 3B. FIG. 3B, which corresponds to FIG. 1F, illustrates a state where B implantation for forming a p-type well region 3p and Ge, C, and B implantations for forming a p-type channel region 4p have been finished. As ions are implanted through the water mark 101, the water mark 101 is driven (knocked on) into the silicon substrate 1 to form an oxide-film-like altered layer 102 near the surface of the silicon substrate 1.

Figure 3C:
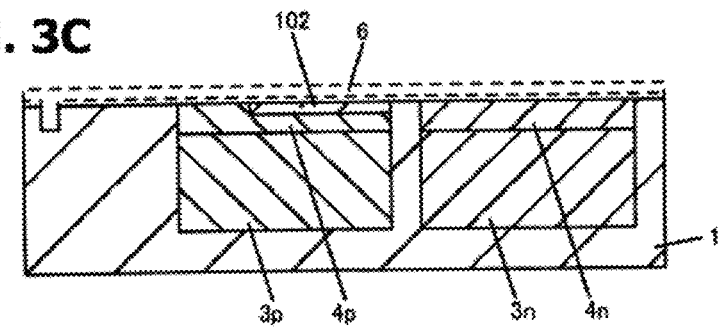

Refer to FIG. 3C. FIG. 3C, which corresponds to FIG. 1I, illustrates a state where the oxide film 6 has been removed by DHF treatment and the surface of the silicon substrate 1 has been etched by TMAH treatment. The altered layer 102 cannot be removed completely and some portions remain unremoved after carrying out the steps for removing the resist pattern RP2, removing the protection film 5, removing the oxide film 6, and etching the surface of the silicon substrate 1, that are performed following the step for ion implantation illustrated in FIG. 3B.

Figure 3D:
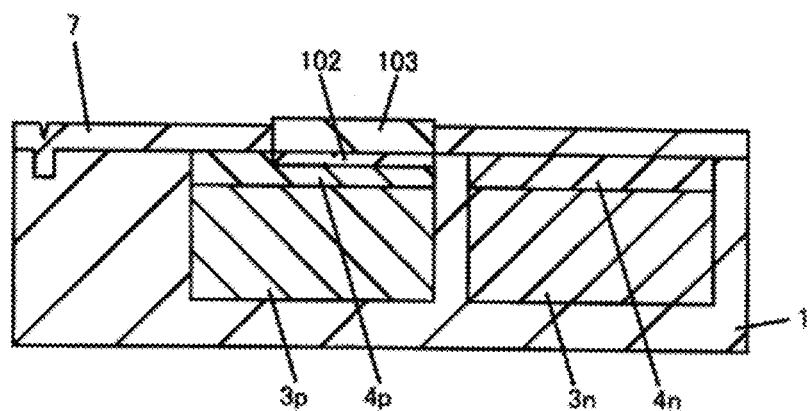
Figure 13:
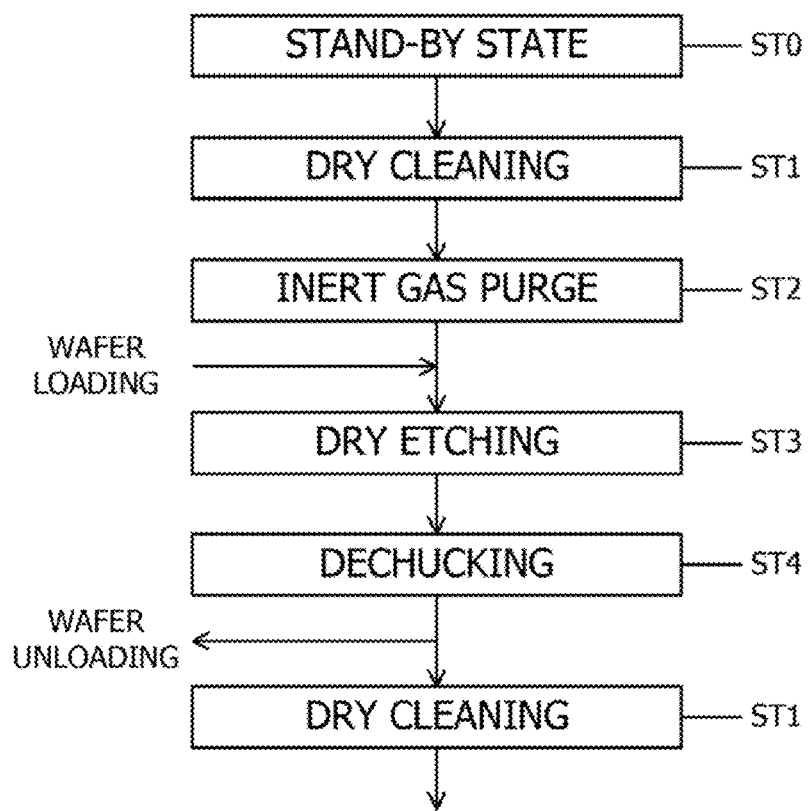
FIG. 13 gives a flow chart that schematically illustrates the operation procedure for a dry etching apparatus used in a modification of the third embodiment.

Refer to FIG. 3D. FIG. 3D, which corresponds to FIG. 13, illustrates a state where a silicon film 7 has been grown on the silicon substrate 1. In the silicon film 7, a portion 103 grown on the altered layer 102 forms polysilicon and constitutes a defect.

Figure 3E:
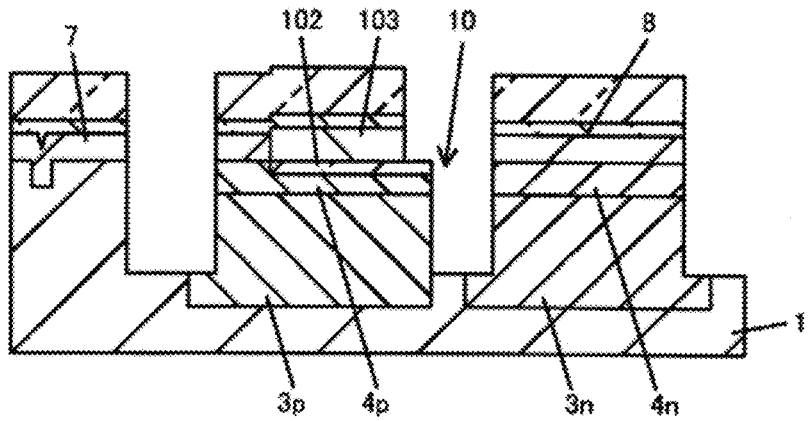

Refer to FIG. 3E. FIG. 3E, which corresponds to FIG. 1K, illustrates a state where element separation grooves 10 have been formed. The silicon substrate 1 must be etched in the element separation groove 10 formation regions. In the region where an altered layer 102 has been formed, however, even if the polysilicon film 103 is successfully etched, the etching treatment is stopped by the oxide-film-like altered layer 102, preventing a good element separation groove 10 from being formed.

Figure 4A:
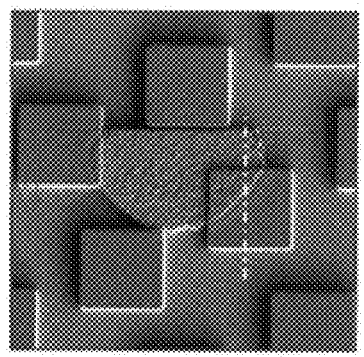
FIGS. 4A and 4B are TEM photographs of flaws seen after element separation groove formation in the comparative example.
Figure 4B:
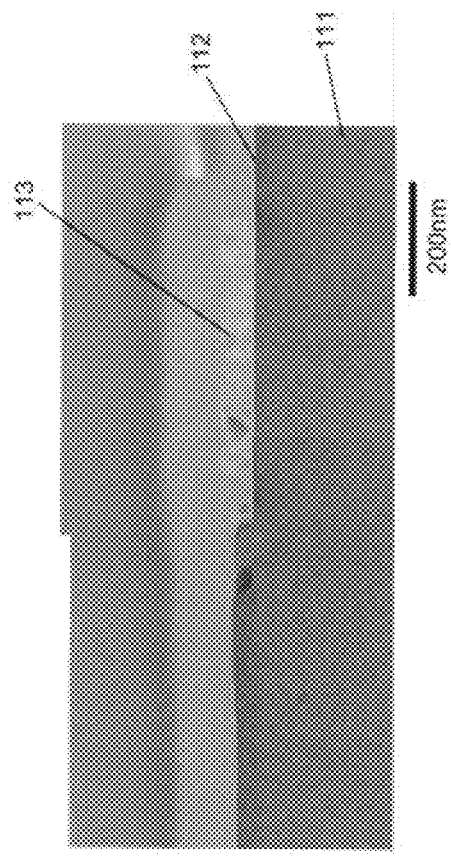

FIGS. 4A and 4B are transmission electron microscopic (TEM) photographs of flaws seen after element separation groove formation. FIG. 4A gives a photograph illustrating a plane structure, and FIG. 4B presents a cross-sectional structure along the dashed-dotted line defined in FIG. 4A.

As seen in FIG. 4A, island-like square active regions have been defined, and element separation grooves have been formed outside the active regions. An element separation groove has not been formed appropriately in the region where defective silicon film growth has taken place (central region of the photograph).

FIG. 4B presents a flaw-containing region existing along the dashed-dotted line defined in FIG. 4A. An altered layer 112, which appears to be an oxide film, is seen on the top face of the silicon substrate 111. A polysilicon film 113 has been formed on the altered layer 112. Here, the observation also contains a silicon nitride film and other materials formed on the polysilicon film 113.

Thus, as described above, the semiconductor device production method according to comparative example tends to cause the growth of a defective epitaxial film and the formation of an inferior element separation groove in an n-type MOS transistor formation region. These faults are considered to be attributed to the process in which a water mark is formed during the resist pattern production on the protection film and subsequently an altered layer is formed near the surface of the semiconductor substrate as an impurity is implanted through the water mark. This problem has not been encountered in p-type MOS transistor formation regions.

Described next is the semiconductor device production method according to the first embodiment. FIGS. 5A to 5I are schematic cross sections illustrating major steps of the semiconductor device production method according to the first embodiment.

First, the same steps as described previously with reference to FIGS. 1A to 1C for the comparative example are carried out to form an n-type well region $3n$ and an n-type channel region $4n$ in a p-type MOS transistor formation region in a silicon substrate 1. Then, the same steps as described previously with reference to FIG. 1D are carried out to remove the resist pattern RP1 used for producing the n-type well region $3n$ and the n-type channel region $4n$ and form a chemical oxide film (protection film) 5.

Figure 5A:
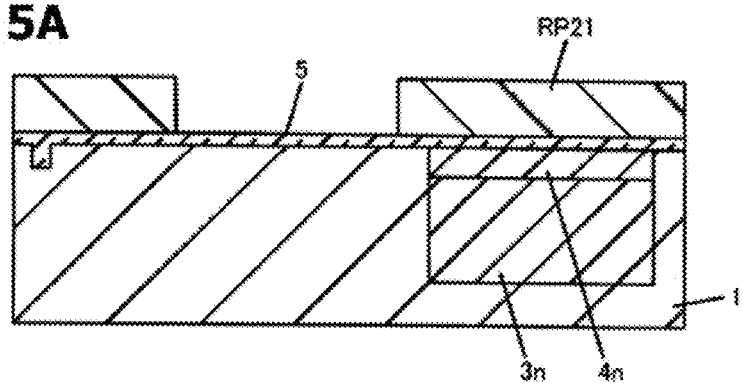
FIGS. 5A to 5I are schematic cross sections illustrating major steps of a semiconductor device production process according to a first embodiment.

Refer to FIG. 5A. The protection film 5 is coated with a photoresist, followed by light exposure, development, and pure water rinsing to form a resist pattern RP21. The resist pattern RP21 has an opening which exposes the n-type MOS transistor formation region.

Figure 5B:
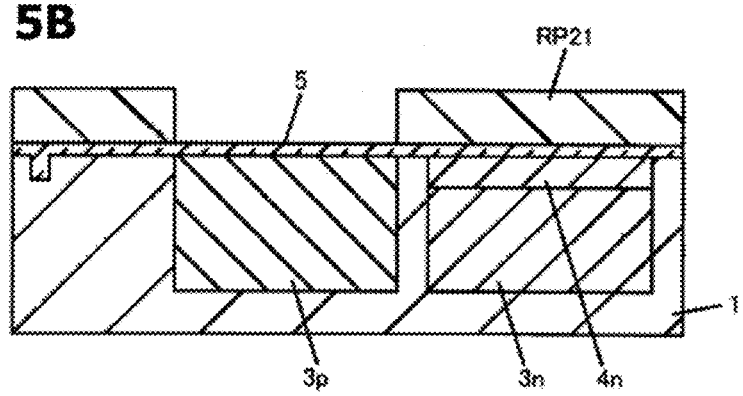

Refer to FIG. 5B. Using the resist pattern RP21 as a mask, impurities are implanted into the silicon substrate 1 through the protection film 5 as described below. For instance, B, used as a p-type impurity, is implanted at an implantation energy of 150 keV to a doze of $7.5 \times 10^{12}$ cm$^{-2}$ from four directions (total doze of $3 \times 10^{13}$ cm$^{-2}$) to form a p-type well region $3p$. Then, Ge is implanted, for instance, at an implantation energy of 50 keV to a doze of $5 \times 10^{14}$ cm$^{-2}$.

Figure 5C:
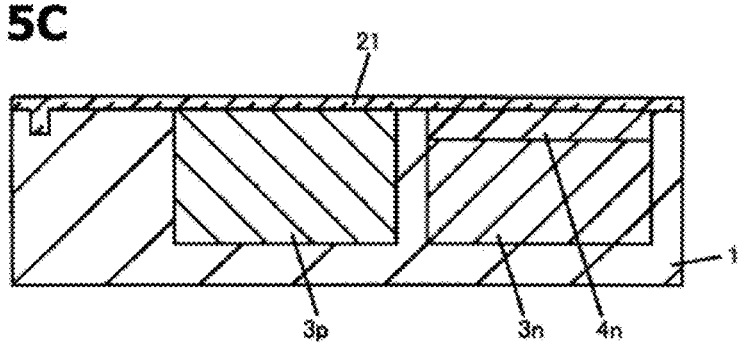

Refer to FIG. 5C. The resist pattern RP21 is removed by ashing and DHF-SPM-APM treatment. The protection film 5 is removed by the DHF treatment. A chemical oxide film is formed by the SPM-APM treatment. Furthermore, APM-DHF-HPM treatment is performed. After the oxide film is removed by the DHF treatment, a chemical oxide film 21 with a thickness of, for instance, about 0.3 nm is formed by the HPM treatment.

Figure 5D:
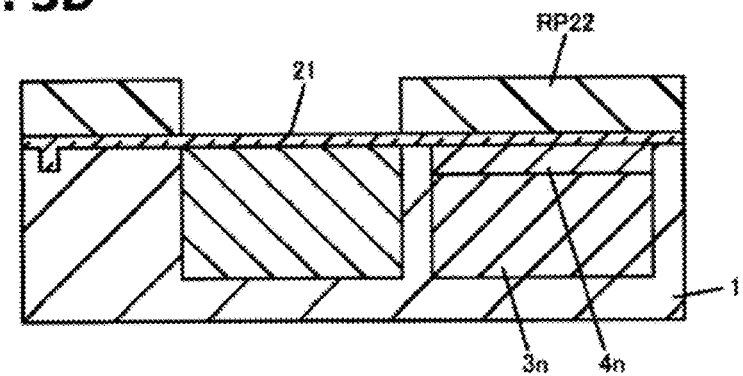

Refer to FIG. 5D. The oxide film 21 is coated with a photoresist, followed by light exposure, development, and pure water rinsing to form a resist pattern RP22 that has an opening which exposes the n-type MOS transistor formation region.

Figure 5E:
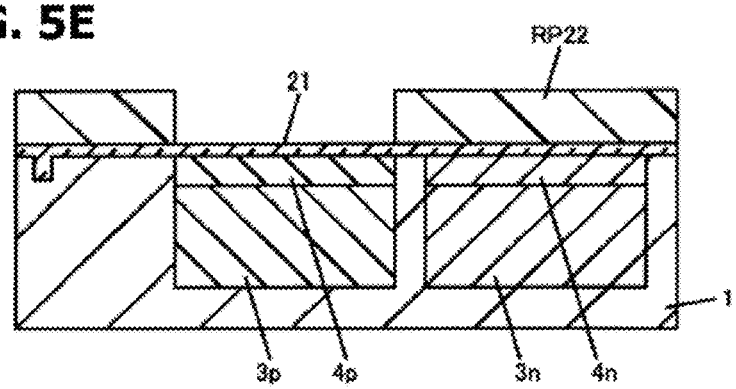

Refer to FIG. 5E. Using the resist pattern RP22 as a mask, impurities are implanted into the silicon substrate 1 through the oxide film 21 (using the oxide film 21 as protection film) as described below. C is implanted, for instance, at an implantation energy of 3 keV to a doze of $3 \times 10^{14}$ cm$^{-2}$. After the C implantation, B, used as a p-type impurity, is implanted at an implantation energy of 2 keV to a doze of $3 \times 10^{13}$ cm$^{-2}$ to form a p-type channel region $4p$.

Figure 5F:
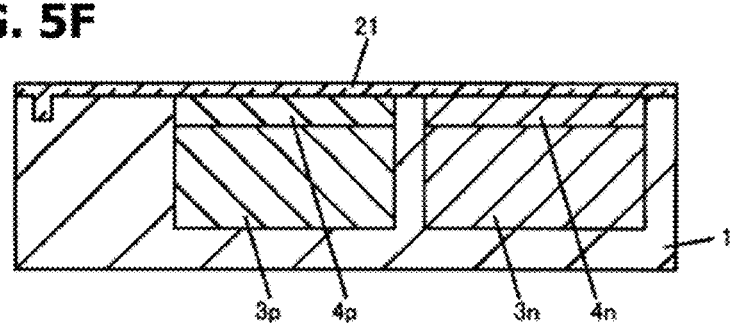

Refer to FIG. 5F. The resist pattern RP22 is removed by SPM-APM treatment. The chemical oxide film 21 slightly thickens as a result of the SPM-APM treatment.

Figure 5G:
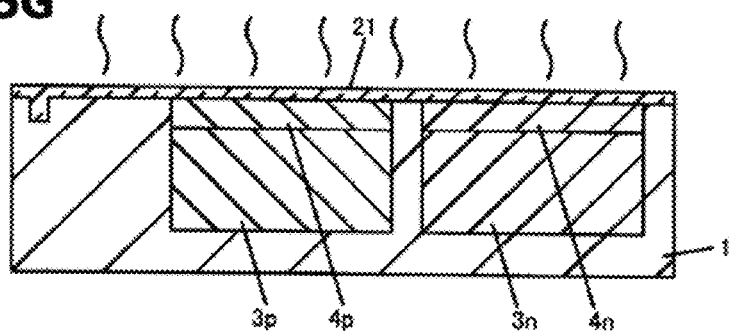

Refer to FIG. 5G. The same steps as described previously with reference to FIG. 1H for the comparative example are carried out to cause crystallization by performing, for instance, heat treatment at 600° C. for 150 seconds.

Figure 5H:
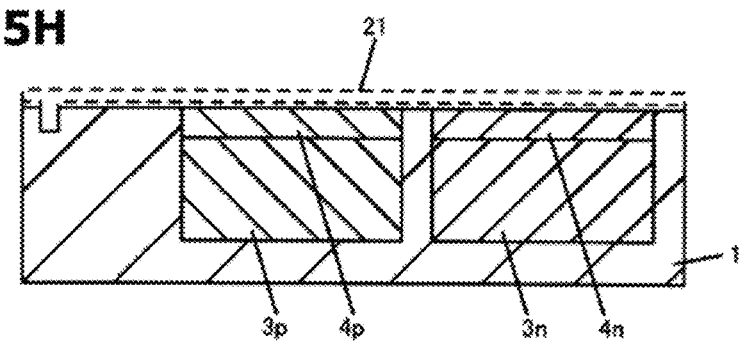

Refer to FIG. 5H. The same steps as described previously with reference to FIG. 1I for the comparative example are carried out to remove the oxide film 21 by DHF treatment and etch the surface of the silicon substrate, for instance, by a 3 nm thickness by TMAH treatment.

Figure 5I:
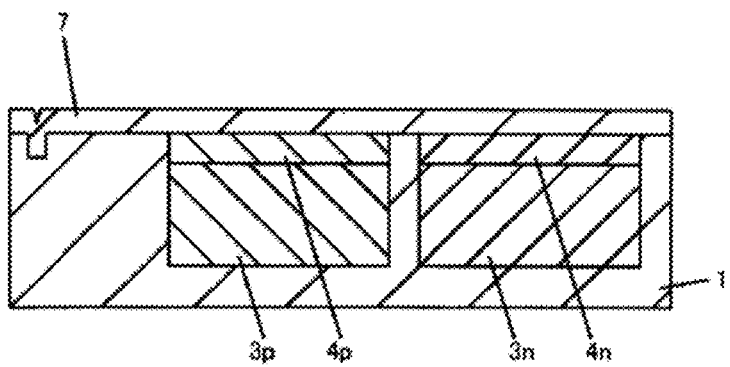

Refer to FIG. 5I. The same steps as described previously with reference to FIG. 1J for the comparative example are carried out to epitaxially grow an undoped silicon film 7 to a thickness of, for instance, 30 nm on the silicon substrate 1.

Following this, the same steps as described previously with reference to FIGS. 1K to 1S for the comparative example are carried out to form MOS transistors in the n-type MOS transistor formation region and the p-type MOS transistor formation region, and then upper layers for wiring structures are formed. Thus, the semiconductor device according to the first embodiment is formed.

When forming a p-type channel region $4p$, the Ge, C, and B implantation steps are carried out continuously in the comparative example (one resist pattern is used in common for Ge, C, and B implantations), while in the first embodiment, the Ge implantation step and the C and B implantation steps are separated (separate resist patterns are use for Ge implantation and C and B implantations). Tests conducted to determine the effect of this separation of impurity implantation steps are described below.

Ge implantation and C and B implantations were carried out separately, and crystallization treatment was conducted. Then, the oxide film and the surface of the silicon substrate were removed, and a silicon film was grown epitaxially, followed by conducting defect measurement. The impurity implantation for well formation was omitted in this test.

Figure 6B:
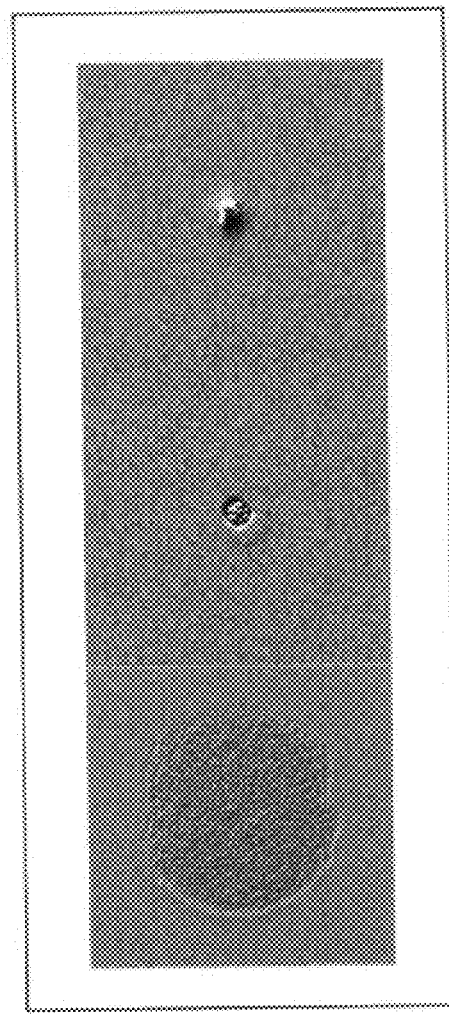
FIG. 6B is a SEM photograph of such defects.
Figure 6A:
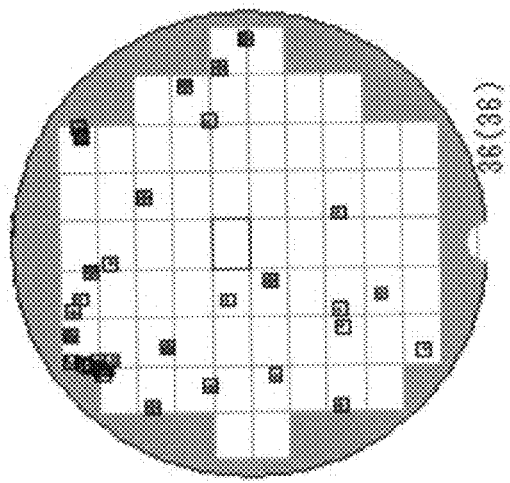
FIG. 6A is a plan view illustrating a distribution of defects on a wafer formed in the first embodiment.

FIG. 6A is a plan view illustrating a distribution of defects on a wafer, and FIG. 6B gives SEM photographs of such defects. As seen from FIG. 6A, the number of defects is much smaller than in the comparative example where the impurity implantation steps were conducted continuously (see FIG. 2A). The specimen contains 36 defects. Three of the defects are presented in FIG. 6B.

Another test conducted to investigate the defects formed in each impurity implantation step is described below. The samples investigated in this test included one prepared by implantation of all Ge, C, and B, i.e., the same one as prepared for the comparative example, one prepared by implantation of only C and B, one prepared by implantation of only B, one prepared by implantation of only Ge, and one prepared by without impurity implantation.

After impurity implantation and subsequent crystallization treatment, the oxide film and the surface of the silicon substrate were removed, and a silicon film was grown epitaxially, followed by conducting defect measurement. The impurity implantation for well formation was omitted in this test. Here, in the case of the impurity-free sample, a silicon film was grown epitaxially directly on the silicon substrate.

Figure 7:
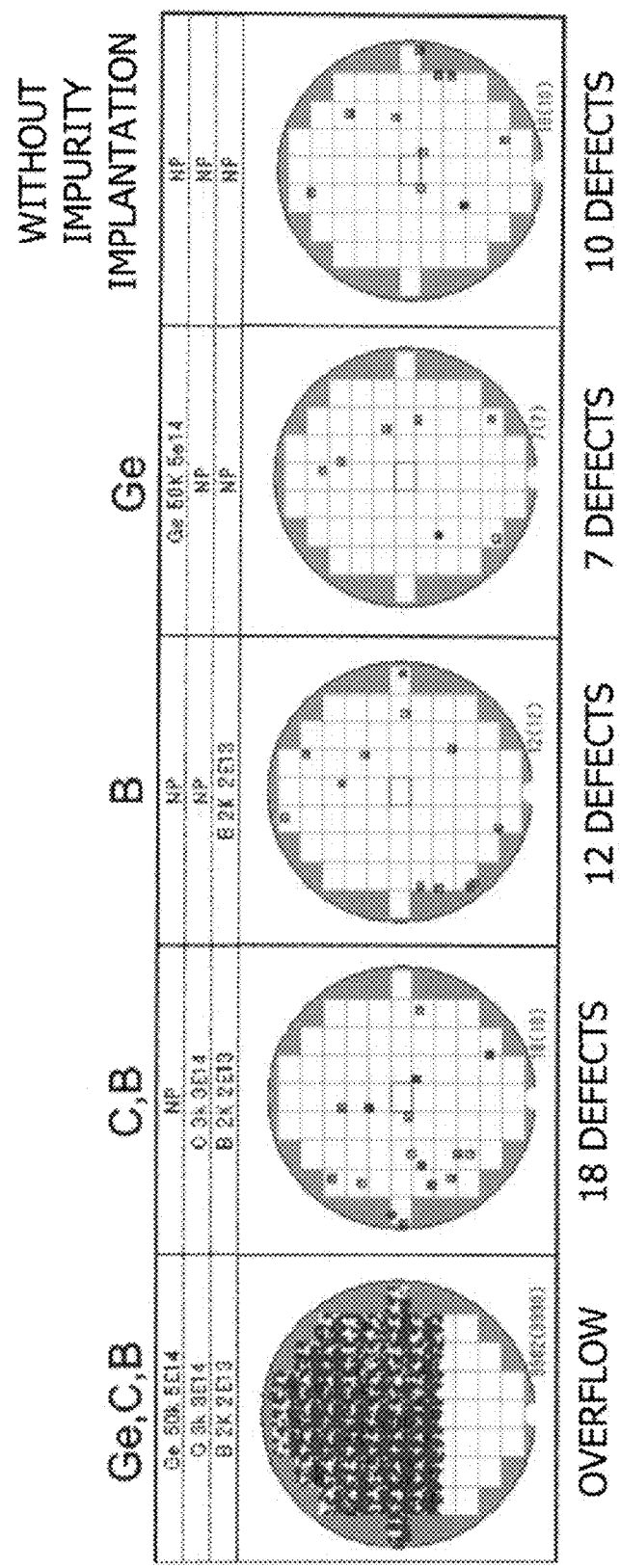
FIG. 7 gives plan views illustrating defect distributions on sample wafers obtained from tests performed for the first embodiment.

FIG. 7 is a plan view comparing the distributions of defects in these wafer samples. The sample prepared for the comparative example by implantation of Ge, C, and B, the one prepared by implantation of only C and B, the one prepared by implantation of only B, the one prepared by implantation of only Ge, and the one prepared by without impurity implantation are presented from left to right. Here, the defect distribution for the comparative example is the same as the one given in FIG. 2A.

The sample of the comparative example, which was prepared by Ge, C, and B implantations, contained a very large number of defects (about 10,000 or more), and overflow took place in the measuring instrument before completion of measurement over the entire surface of the wafer. Compared to this, the number of defects was 18 in the sample containing only C and B, 12 in the sample containing only B, and 7 in the sample containing only Ge.

Considering the fact that the number of defects was 10 in the impurity-free sample, it can be deemed that defect formation is suppressed in the samples containing only C and B, only B, or only Ge as effectively as in the impurity-free sample. This suggests that separate implementation of the Ge (or Si) implantation step and the C and B implantation steps is effective for suppression of defect formation.

It is considered that in the semiconductor device production method according to the first embodiment, the separate implementation of impurity implantation steps serves to suppress the knock-on effect on water marks to prevent the formation of an altered layer. This will be helpful in preventing defect formation etc. in the epitaxial film growth.

Described next is the semiconductor device production method according to the second embodiment. FIGS. 8A to 8D are schematic cross sections illustrating major steps of the semiconductor device production process according to the second embodiment.

First, the same steps as described previously with reference to FIGS. 1A to 1C for the comparative example are carried out to form an n-type well region 3n and an n-type channel region 4n in a p-type MOS transistor formation region in a silicon substrate 1.

Next, the same steps as described previously with reference to FIGS. 1D to 1F are carried out to form a p-type well region 3p and a p-type channel region 4p in an n-type MOS transistor formation region in the silicon substrate 1. In the second embodiment, Ge, C, and B implantation steps are carried out continuously as in the comparative example.

Then, the same step as described previously with reference to FIG. 1G is carried out to remove the resist pattern RP2 used for producing the p-type well region 3p and the p-type channel region 4p. A chemical oxide film 6 with a thickness of, for instance, about 0.8 nm is formed by the SPM-APM treatment that is carried out for removing the resist pattern RP2.

Figure 8A:
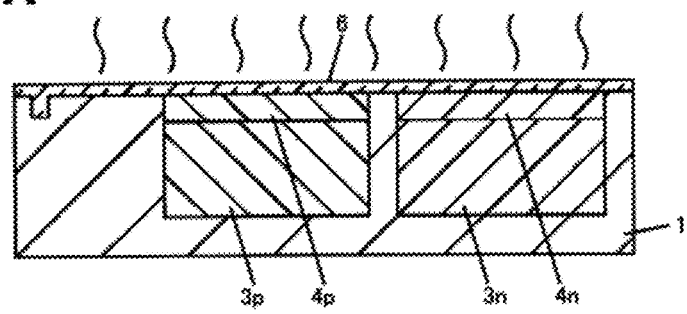
FIGS. 8A to 8D are schematic cross sections illustrating major steps of a semiconductor device production process according to a second embodiment.

Refer to FIG. 8A. The same step as described previously with reference to FIG. 1H for the comparative example is carried out to cause crystallization by performing, for instance, heat treatment at 600° C. for 150 seconds.

Figure 8B:
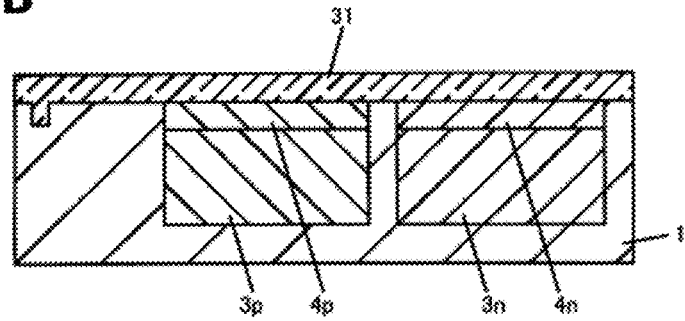

Refer to FIG. 8B. On the surface of the semiconductor substrate 1, a chemical reaction layer 31 in which surface atoms are taken in from the semiconductor substrate is formed by chemical reaction. For instance, thermal oxidation is carried out at 810° C. to grow an oxide film 31 with a thickness of 3 nm on the surface of the silicon substrate 1. It is preferable that the thermal oxidation be performed in the temperature range of, for instance, 750° C. to 850° C. It is preferable that the oxidization is performed in about 10 seconds to 60 seconds in a so-called ISSG atmosphere that is composed of a mixture of active hydrogen and oxygen and effective in accelerating the growth of the oxide film. The oxide film 31 preferably has a thickness of, for instance, 3 nm to 6 nm.

Figure 8C:
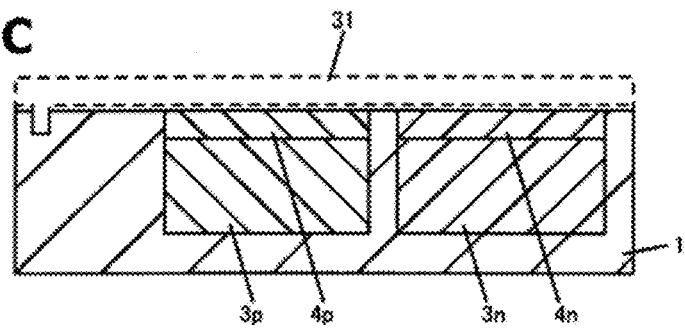

Refer to FIG. 8C. Chemical treatment is carried out to remove the chemical reaction layer 31 and remove the surface of the semiconductor substrate 1. For instance, DHF treatment is carried out to remove the oxide film 31, and furthermore, APM treatment is carried out at 65° C. to etch the surface of the silicon substrate 1, for instance, by a 3 nm thickness. Here, the surface of the silicon substrate can be removed by TMAH treatment instead of APM treatment.

Figure 8D:
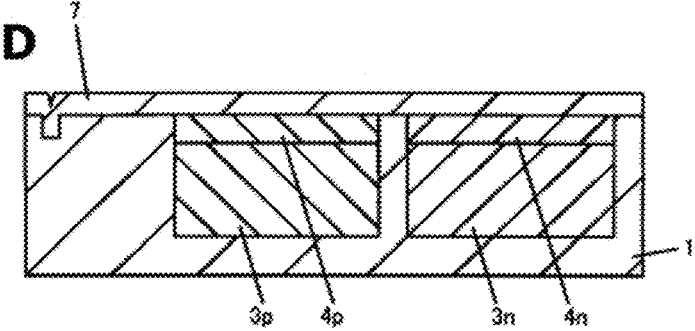

Refer to FIG. 8D. The same step as described previously with reference to FIG. 13 for the comparative example is carried out to epitaxially grow an undoped silicon film 7 to a thickness of, for instance, 30 nm on the silicon substrate 1.

Following this, the same steps as described previously with reference to FIGS. 1K to 1S for the comparative example are carried out to form MOS transistors in the n-type MOS transistor formation region and the p-type MOS transistor formation region, and then upper layers for wiring structures are formed. Thus, the semiconductor device according to the second embodiment is formed.

The second embodiment includes a step for forming a chemical reaction layer in which surface atoms are taken in from the semiconductor substrate. Tests conducted to determine the effect of this chemical reaction layer are described below.

After carrying out implantation of Ge, C, and B, crystallization treatment, and formation of an oxide film as a chemical reaction layer, chemical treatment was carried out to remove the chemical reaction layer and remove the surface of the substrate, and a silicon film was grown epitaxially, followed by carrying out defect measurement. The impurity implantation for well formation was omitted in this test.

Figure 9B:
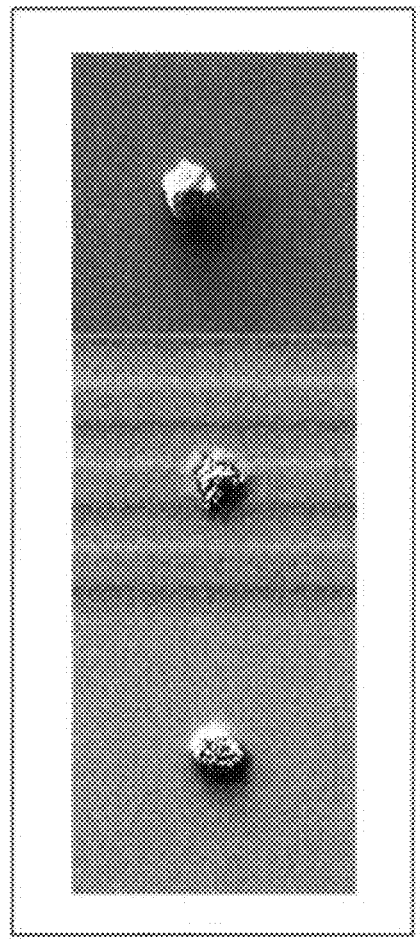
FIG. 9B is a SEM photograph of such defects.
Figure 9A:
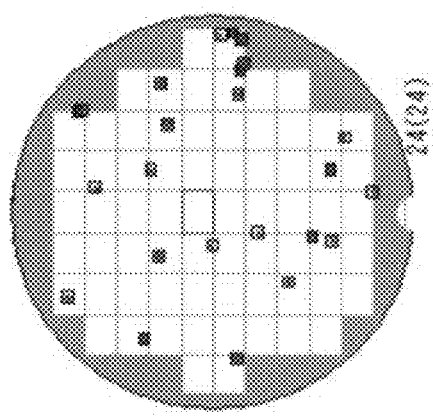
FIG. 9A is a plan view illustrating a distribution of defects on a wafer formed in the second embodiment.

FIG. 9A is a plan view illustrating a distribution of defects on a wafer, and FIG. 9B gives scanning electron microscopic (SEM) photographs of such defects. As seen from FIG. 9A, the number of defects is much smaller than in the comparative example where a chemical reaction layer is not formed (see FIG. 2A). The specimen contains 24 defects. Three of the defects are presented in FIG. 2B.

It is considered that in the semiconductor device production method according to the second embodiment, a chemical reaction layer is formed so as to take in the altered layer formed on the surface of the semiconductor substrate and that the altered layer is removed effectively when the chemical reaction layer and the surface of the substrate are removed. This will be helpful in preventing defect formation etc. in the epitaxially grown semiconductor layer.

The first embodiment, in which separate masks are used for the Ge implantation and C/B implantation, may require a larger production cost than for the comparative example because additional masking steps are necessary whereas the second embodiment includes the same masking steps as in the comparative example and does not require an increased production cost. Thus, the second embodiment is preferable from the viewpoint of preventing an increase in the number of masking steps.

In the aforementioned second embodiment, chemical treatment is carried out to remove the chemical reaction layer and remove the surface of the substrate. As a modification of the second embodiment, dry etching may be carried out for the removal of the chemical reaction layer and removal of the surface of the substrate.

Figure 10A:
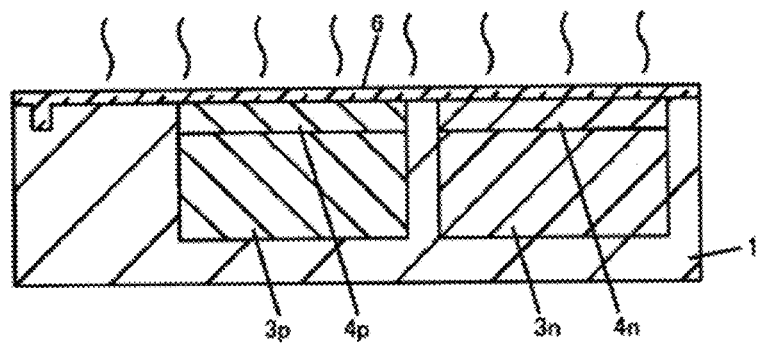
FIGS. 10A to 10C are schematic cross sections illustrating major steps of a semiconductor device production process according to a third embodiment.
Figure 10B:
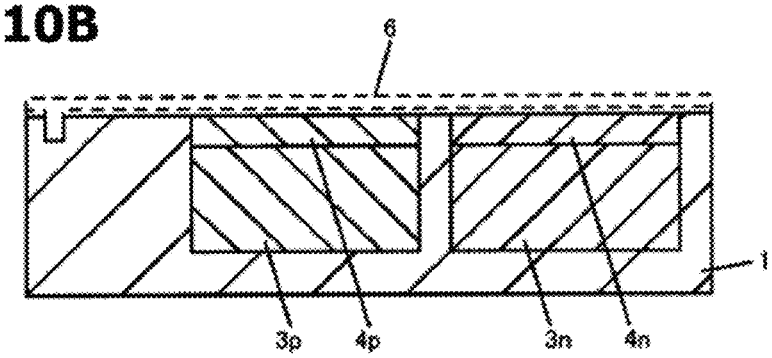
Figure 10C:
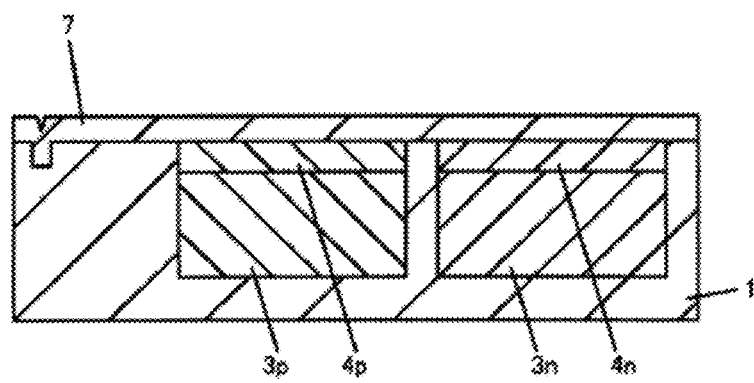

Described next is the semiconductor device production method according to the third embodiment. FIGS. 10A to 10C are schematic cross sections illustrating major steps of the semiconductor device production process according to the third embodiment.

First, the same procedure as for the second embodiment is carried out down to the steps for forming a p-type well region 3p and a p-type channel region 4p and removing the resist pattern RP2. A chemical oxide film 6 with a thickness of, for instance, about 0.8 nm is formed as a result of SPM-APM treatment that is designed for removing the resist pattern RP2.

Refer to FIG. 10A. The same step as described previously with reference to FIG. 8A for the second embodiment (or, the same step as described previously with reference to FIG. 1H for the comparative example) is carried out to cause crystallization by performing, for instance, heat treatment at 600° C. for 150 seconds.

Refer to FIG. 10B. Dry etching is carried out to remove the oxide film 6 and furthermore, the surface of the silicon substrate 1 is etched by, for instance a 7 nm thickness. This dry etching preferably uses an etching gas that can etch silicon oxide and silicon at roughly the same rate, and the gas to be used preferably contains at least one selected from the group consisting of, for instance, $SF_6$, $CF_4$, $CHF_3$, and $NF_3$. It is preferable that the etching gas be free of $O_2$.

The conditions for the etching step may be, for instance, as follows: The first example set of conditions include a pressure of 5 mTorr to 20 mTorr, maximum power of 300 W to 500 W, bias power of 50 W to 100 W, etching gas of $CF_4$ (flow rate of 100 sccm), and treatment period of 5 seconds to 10 seconds. Here, He (flow rate of 200 sccm) may be added to the etching gas. The second example set of conditions include a pressure of 2 mTorr to 10 mTorr, maximum power of 300 W to 500 W, bias power of 50 W to 100 W, etching gas of $SF_6$ (flow rate of 5 sccm to 15 sccm) and $CF_4$ (flow rate of 50 sccm to 100 sccm), and treatment period 5 seconds to 10 seconds. Here, $N_2$ (flow rate of 20 sccm) may be added to the etching gas.

Refer to FIG. 10C. The same step as described previously with reference to FIG. 8D for the second embodiment (or, the same step as described previously with reference to FIG. 13 for the comparative example) is carried out to grow an undoped silicon film 7 with a thickness of, for instance, 30 nm epitaxially on the silicon substrate 1.

Following this, the same steps as described previously with reference to FIGS. 1K to 1S for the comparative example are carried out to form MOS transistors in the n-type MOS transistor formation region and the p-type MOS transistor formation region, and then upper layers for wiring structures are formed. Thus, the semiconductor device according to the third embodiment is formed.

In the comparative example, the oxide film was removed by DHF treatment before growing a silicon film, and the surface of the silicon substrate was removed by TMAH treatment. In the third embodiment, both the removal of the oxide film and the removal of the surface of the substrate were carried out by dry etching before growing a silicon film. Tests conducted to examine the effect of this dry etching are described below.

After performing Ge, C, and B implantation and subsequent crystallization treatment, the removal of the oxide film and the removal of the surface of the substrate were carried out by dry etching, and a silicon film was grown epitaxially, followed by conducting defect measurement. The impurity implantation for well formation was omitted in this test.

Figure 11:
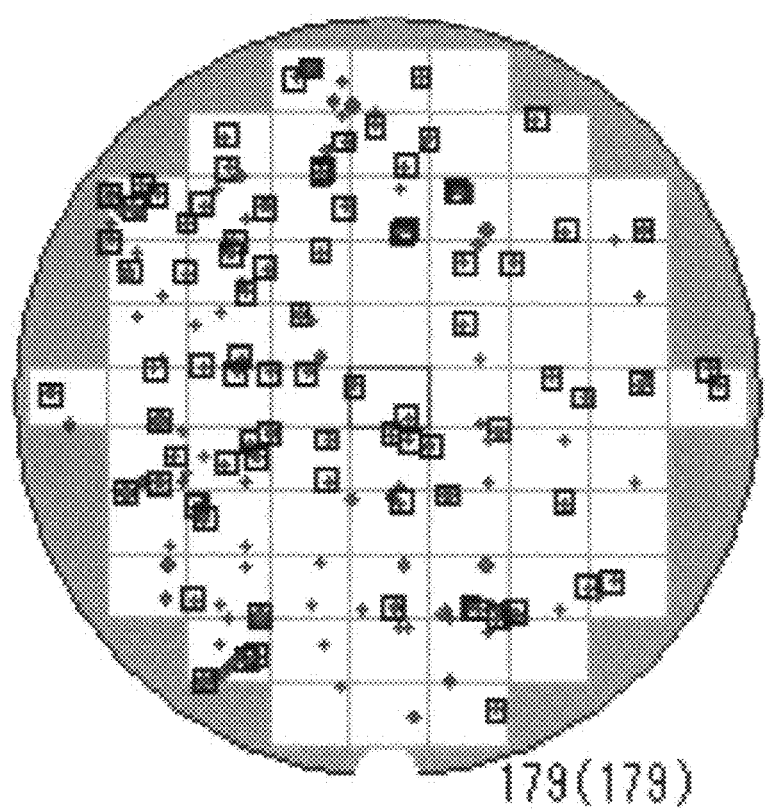
FIG. 11 is a plan view illustrating a distribution of defects on a wafer formed in the third embodiment.

FIG. 11 is a plan view illustrating a distribution of defects on a wafer. The number of defects is much smaller than in the comparative example where chemical treatment is carried out to remove the oxide film and remove the surface of the silicon substrate (see FIG. 2A). The specimen contains 179 defects.

It is considered that in the semiconductor device production method according to the third embodiment, the altered layer is removed effectively when dry etching is performed to remove the oxide film and remove the surface of the semiconductor substrate. This will be helpful in preventing defect formation etc. in the epitaxially grown semiconductor layer.

Investigation was conducted with the aim of further improving the semiconductor device production method according to the third embodiment. Many samples were prepared by using different methods for the removal of the oxide film and the removal of the surface of the silicon substrate before growing a silicon film.

To prepare sample S1, both the removal of the oxide film and the removal of the surface of the silicon substrate that precede the silicon film growth step were carried out by dry etching (etching gas $CF_4$), and in doing this, a 7 nm thick surface layer was removed from the silicon substrate. Sample S1 represents the third embodiment.

In addition, sample S2, which represents the comparative example, was prepared by the removal of the oxide film and the removal of the surface of the silicon substrate, which preceded the silicon film growth step, were carried out by DHF treatment and TMAH treatment and in doing this, a 3 nm thick surface layer was removed from the silicon substrate. Sample S3 was prepared by conducting DHF treatment and APM treatment and removing a 3 nm surface layer from the silicon substrate, and sample S4 was prepared by conducting DHF treatment and APM treatment and removing a 6 nm surface layer from the silicon substrate.

Figure 12A:
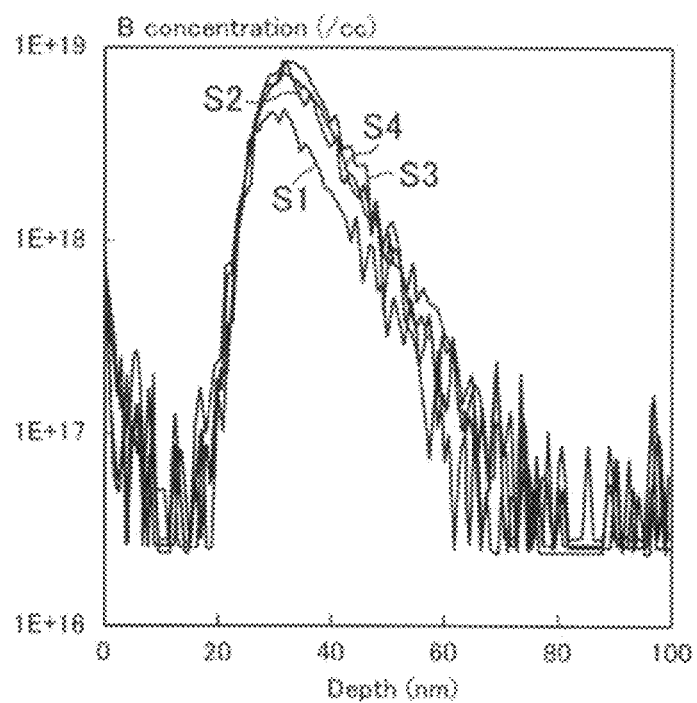
FIGS. 12A and 12B illustrate the distributions of the B and O concentrations, respectively, in the depth direction of samples obtained from tests performed for the third embodiment.
Figure 12B:
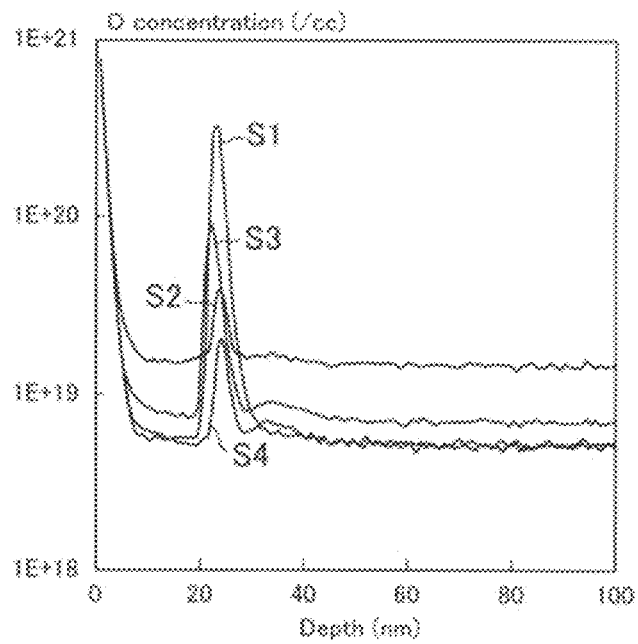

FIGS. 12A and 12B illustrate the distributions of the B and O concentrations, respectively, in the depth direction of the samples. The removal of the oxide film and the removal of the surface of the silicon substrate, which preceded the silicon film growth step, were carried out first, and then a silicon film was grown, followed by measuring the B and O concentrations. The concentration measurement was performed by secondary ion mass analysis (SIMS).

As seen from FIG. 12A, the B concentration curve has a peak near the substrate surface (at a depth of about 30 nm) before the silicon film growth step. The B concentration in sample S1 representing the third embodiment is slightly lower than in samples S2 to S4 representing the comparative example. This suggests that too thick a surface layer was removed from the substrate in the case of the sample representing the third embodiment (7 nm thick surface layer removed from the silicon substrate).

As seen from FIG. 12B, the O concentration curve also has a peak near the substrate surface (at a depth of about 30 nm) before the silicon film growth step. It is considered that the O concentration peak can be attributed to the oxygen atoms knocked on into the silicon substrate in the impurity implantation and other steps.

The O concentration in sample S1 representing the third embodiment is slightly higher than in samples S2 to S4 representing the comparative example. For the third embodiment, the dry etching carried out for the removal of the oxide film and the removal of the surface of the silicon substrate, which preceded the silicon film growth step, serves to suppress the defect formation in the grown silicon film, but the O concentration is seen to increase although the etching gas is free of oxygen. This increase in the O concentration can be prevented by using an improved procedure for operating the dry etching apparatus as described below.

FIG. 13 gives a flow chart schematically illustrating the improved procedure for operating the dry etching apparatus. Following a stand-by state ST0, a dry cleaning step ST1 is carried out to clean the chamber of the dry etching apparatus.

The dry cleaning step ST1 contains two runs of dry cleaning. The first run of dry cleaning uses $SF_6$ or $NF_3$ to remove Si-containing residues. The second run of dry cleaning uses $O_2$ plasma to remove C-containing residues.

An inert gas purge step ST2 is carried out following the dry cleaning step ST1. For instance, $N_2$ is used as the inert gas.

After the inert gas purge step ST2, the wafer to be treated is transferred into the chamber of the dry etching apparatus and subjected to the dry etching step ST3. The improved procedure contains an additional inert gas purge step ST2. In the original procedure, the wafer under treatment is transferred, after the dry cleaning step ST1, directly to the chamber where it is subjected to the dry etching step ST3.

The dry cleaning step ST1 uses oxygen plasma to remove C based residues, leaving an oxygen residue in the chamber. If the dry etching step ST3 is performed in the presence of the oxygen residue, the oxygen can be knocked on by the dry etching into the silicon substrate.

In the improved procedure, the inert gas purge step ST2 is interposed between the dry cleaning step ST1 and the dry etching step ST3. This allows the atmosphere of the dry etching step ST3 to be free of oxygen, thereby preventing the knocking-on of oxygen from being caused by the dry etching.

The dry etching step ST3 can use a gas containing at least one selected from the group consisting of, for instance, $SF_6$, $CF_4$, $CHF_3$, and $NF_3$, as described above. It is preferable that the etching gas be free of $O_2$. The absence of oxygen in the etching gas serves to prevent the knocking-on of oxygen from being caused by the dry etching.

The dry etching step ST3 is followed by a wafer dechucking step ST4. Plasma treatment is carried out to detach the wafer from the electrostatic chuck. Oxygen plasma has been used for the dechucking step ST4 in the original procedure. The oxygen plasma treatment can act to knock on oxygen into the silicon substrate.

In the improved procedure, inert gas plasma, such as Ar plasma, is used for the dechucking step ST4. This serves to prevent the knocking-on of oxygen from being caused by the plasma treatment in the dechucking step ST4.

After the dechucking step ST4, the dry-etched wafer is transferred out of the chamber. After the wafer has been discharged, the chamber is subjected again to the dry cleaning step ST1. Subsequently, the inactive gas purge step ST2 is performed and the next wafer to be treated is fed and subjected to the dry etching step ST3. This process is carried out repeatedly.

A sample was prepared according to a modification of the third embodiment, in which only a 5 nm, instead of 7 nm, thick surface layer is removed from the silicon substrate to prevent a significant decrease in the B concentration and the aforementioned improved procedure for operation of the dry etching apparatus is adopted to prevent a significant increase in the O concentration.

Figure 14A:
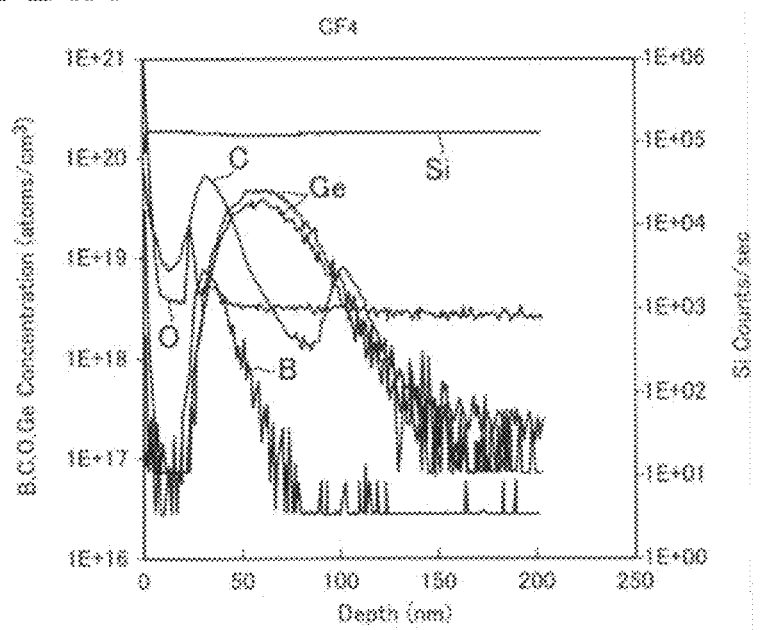
FIGS. 14A and 14B illustrate the distributions of C, O, B, Ge, and Si concentrations in the depth direction of samples obtained from the modification of the third embodiment.
Figure 14B:
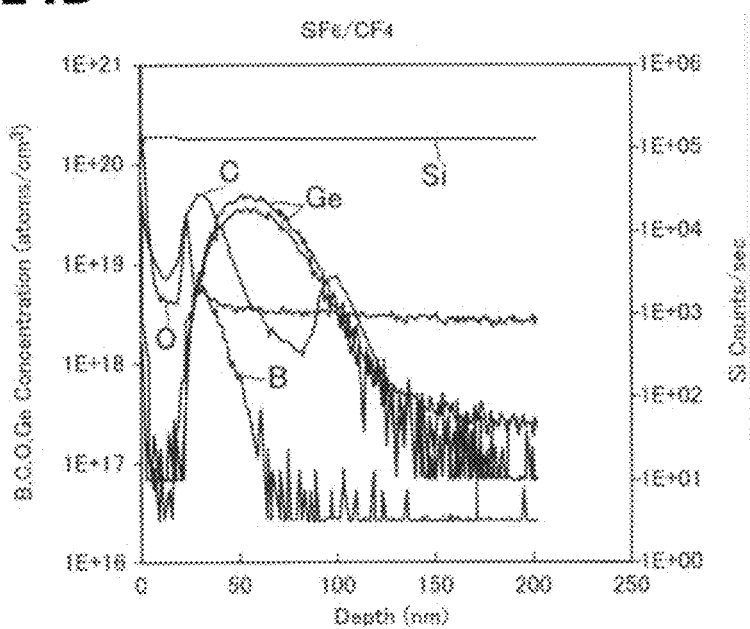

FIGS. 14A and 14B illustrate the distributions of the C, O, B, Ge, and Si concentrations in the depth direction of samples obtained from a modification according to the third embodiment. The Ge concentration covers the two isotopes of $^{72}Ge$ and $^{74}Ge$. FIGS. 14A and 14B give distributions obtained when $CF_4$ alone and a mixture of $SF_6$ and $CF_4$ were used respectively as etching gas for the dry etching step preceding the silicon film growth step.

For both of the etching gases, the B concentration peak is higher and the O concentration peak is lower than those presented in FIGS. 12A and 12B for the third embodiment (a 7 nm thick surface layer is removed from the silicon substrate, and dry etching is carried out by the original procedure).

In this way, preferable concentration distributions can be achieved for B, O, and other substances by adjusting the thickness of the surface layer to be removed from the silicon substrate in the dry etching step preceding the silicon film growth and by using an improved procedure for operating the dry etching apparatus in the step. Here, an optimum thickness of the surface layer to be removed from the silicon substrate can be determined empirically depending on requirements of specific products.

Described next is the semiconductor device production method according to the fourth embodiment. The production method according to the fourth embodiment is a combination of those according to the first and second embodiments. Specifically, the impurity implantation steps are separated as in the first embodiment, and a chemical reaction layer is formed as in the second embodiment, followed by removing the chemical reaction layer and a surface of the semiconductor substrate.

First, the same procedure as in the first embodiment is carried out down to the crystallization treatment step illustrated in FIG. 5G. Then, a chemical reaction layer is formed as illustrated in FIG. 8B by the same procedure as in the second embodiment. Removal of the chemical reaction layer and removal of the surface of the substrate are carried out as illustrated in FIG. 8C. The remaining steps are carried out according to the second embodiment to grow a silicon film, thus providing a semiconductor device.

A fifth embodiment may be presented as a combination of the first and third embodiments. Specifically, in the fifth embodiment, the impurity implantation steps are separated as in the first embodiment, and the removal of the chemical reaction layer and removal of the surface of the semiconductor substrate are carried out by dry etching as in the third embodiment.

Thus, as described above, problems resulting from implanting impurity ions into the semiconductor substrate using, as a mask, a resist pattern formed on the protection film can be solved by adopting the methods according to the first to fifth embodiments. For instance, the epitaxial growth of a semiconductor layer on the surface of a semiconductor substrate can be performed more easily after impurity ion implantation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device production method comprising:
   forming a first protection film on a semiconductor substrate;
   forming a first resist pattern, which has an opening portion defining a well region in a surface of the semiconductor substrate, on the first protection film;
   implanting a first p-type impurity ion into the well region of the semiconductor substrate using the first resist pattern as a mask, and the well region being p-type;
   implanting a first impurity ion into the well region of the semiconductor substrate using the first resist pattern as a mask;
   removing the first resist pattern;
   removing the first protection film;
   forming a second protection film on the semiconductor substrate after the removing of the first protection film;
   forming a second resist pattern which has an opening portion defining a channel region in the well region of the semiconductor substrate, on the second protection film;
   implanting a second impurity ion into the channel region of the semiconductor substrate using the second resist pattern as a mask;
   implanting a second p-type impurity ion into the channel region of the semiconductor substrate using the second resist pattern as a mask, after the implanting of the second impurity ion, and the channel region being p-type;
   removing the second resist pattern;
   removing the second protection film and
   growing a semiconductor layer epitaxially on the semiconductor substrate, after the removing of the second resist pattern.

2. The semiconductor device production method according to claim 1, further comprising removing the surface of the semiconductor substrate before the epitaxial growing of the semiconductor layer, after the removing of the second protection film.

3. The semiconductor device production method according to claim 1, wherein the first impurity ion is either germanium or silicon.

4. The semiconductor device production method according to claim 1, wherein the second impurity ion is carbon.

5. The semiconductor device production method according to claim 1, wherein the first p-type impurity ion and the second p-type impurity ion are boron ion.

* * * * *